United States Patent [19]

Nielsen

[11] 4,432,067
[45] Feb. 14, 1984

[54] MEMORY CARTRIDGE FOR VIDEO GAME SYSTEM

[75] Inventor: Carl J. Nielsen, Saratoga, Calif.

[73] Assignee: Atari, Inc., Sunnyvale, Calif.

[21] Appl. No.: 406,650

[22] Filed: Aug. 9, 1982

Related U.S. Application Data

[62] Division of Ser. No. 261,301, May 7, 1981, Pat. No. 4,368,515.

[51] Int. Cl.³ ............................................. G06F 15/44
[52] U.S. Cl. ............................ 364/900; 273/DIG. 28; 364/410
[58] Field of Search ... 364/200 MS File, 900 MS File, 364/410, 411; 273/85 G, DIG. 28; 340/724, 709

[56] References Cited

U.S. PATENT DOCUMENTS

| | | | |
|---|---|---|---|
| 3,292,151 | 12/1966 | Barnes et al. | 364/200 |
| 3,737,860 | 6/1973 | Sporer | 364/200 |
| 4,118,773 | 10/1978 | Raguin et al. | 364/200 |
| 4,156,928 | 5/1979 | Inose et al. | 364/900 |
| 4,180,805 | 12/1979 | Burson | 340/724 X |
| 4,359,222 | 11/1982 | Smith et al. | 273/85 G |

OTHER PUBLICATIONS

"Extended Bank Switching", Intel Corporation, Nov. '74, pp. 1-15 to 1≧17.
Poppendieck, M. et al., "Memory Extension Techniques for Minicomputers", Computer, May 1977, pp. 68-75.

*Primary Examiner*—Thomas M. Heckler
*Attorney, Agent, or Firm*—Townsend and Townsend

[57] ABSTRACT

A decoding circuit is coupled to the signal lines that communicate address signals to a memory unit. When a predetermined address is communicated, the decoding circuit produces a supplemental signal that is coupled to the memory unit and used to select one of a plurality of groups of memory locations. The communicated address signals specify the memory location of the selected group to be accessed.

15 Claims, 6 Drawing Figures

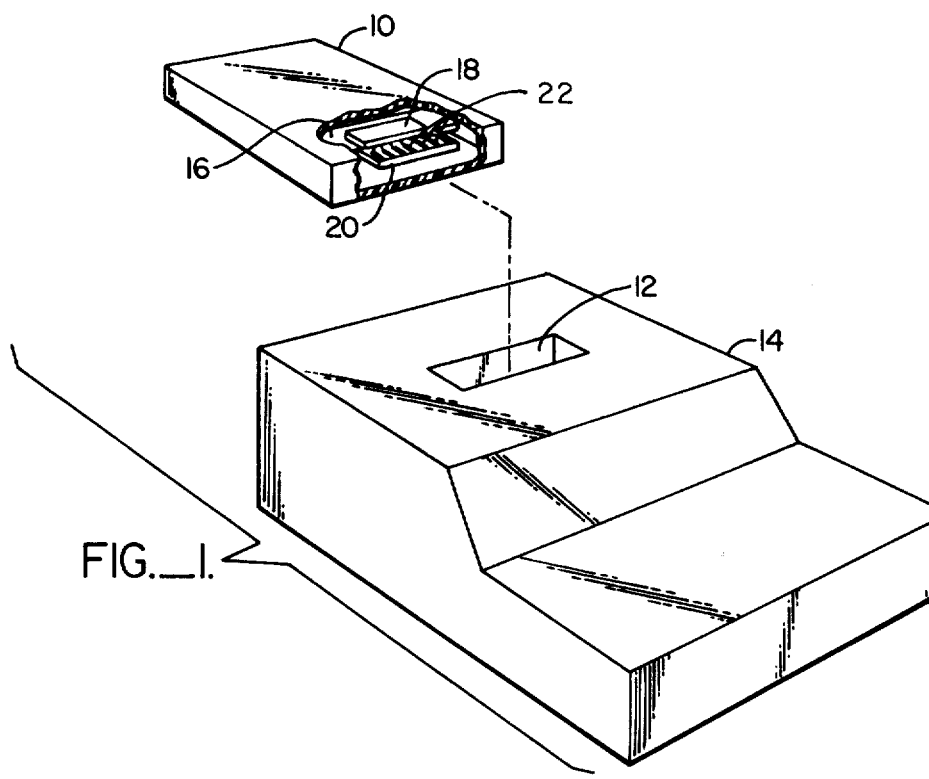
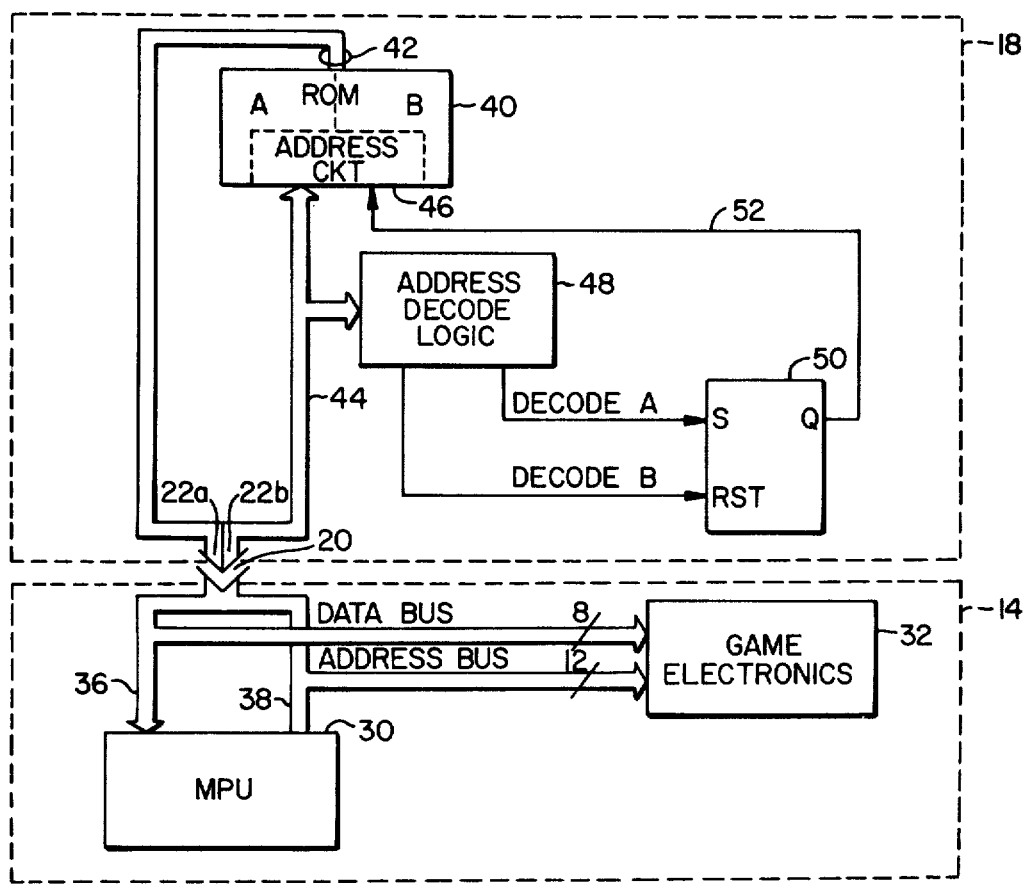

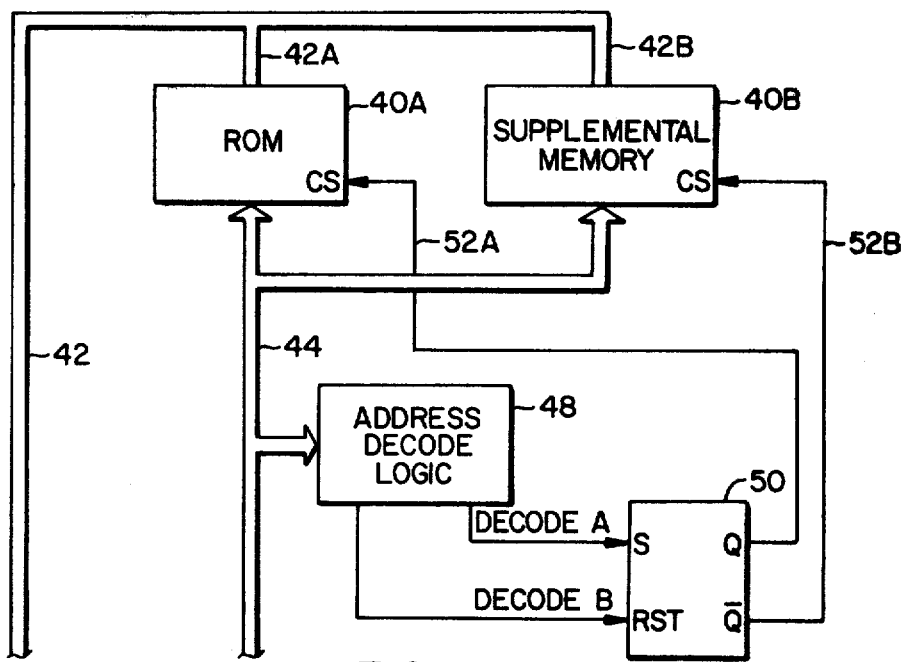
FIG._3.
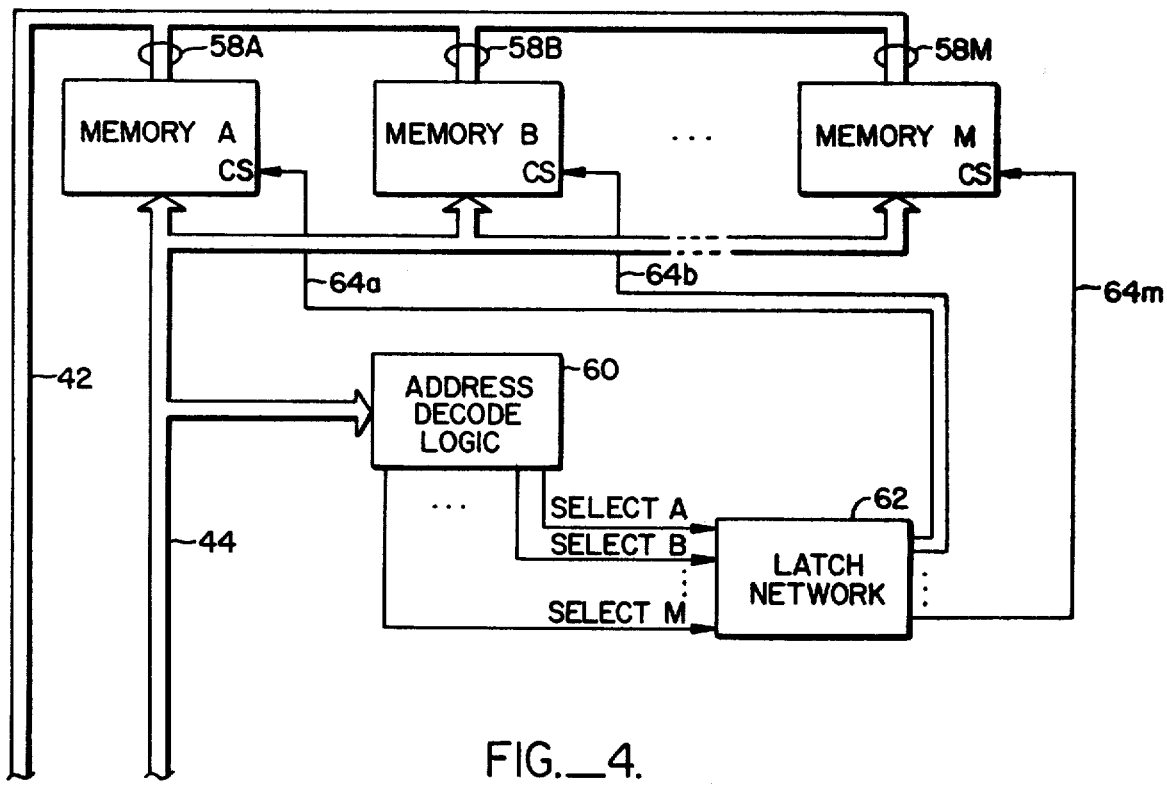
FIG._4.

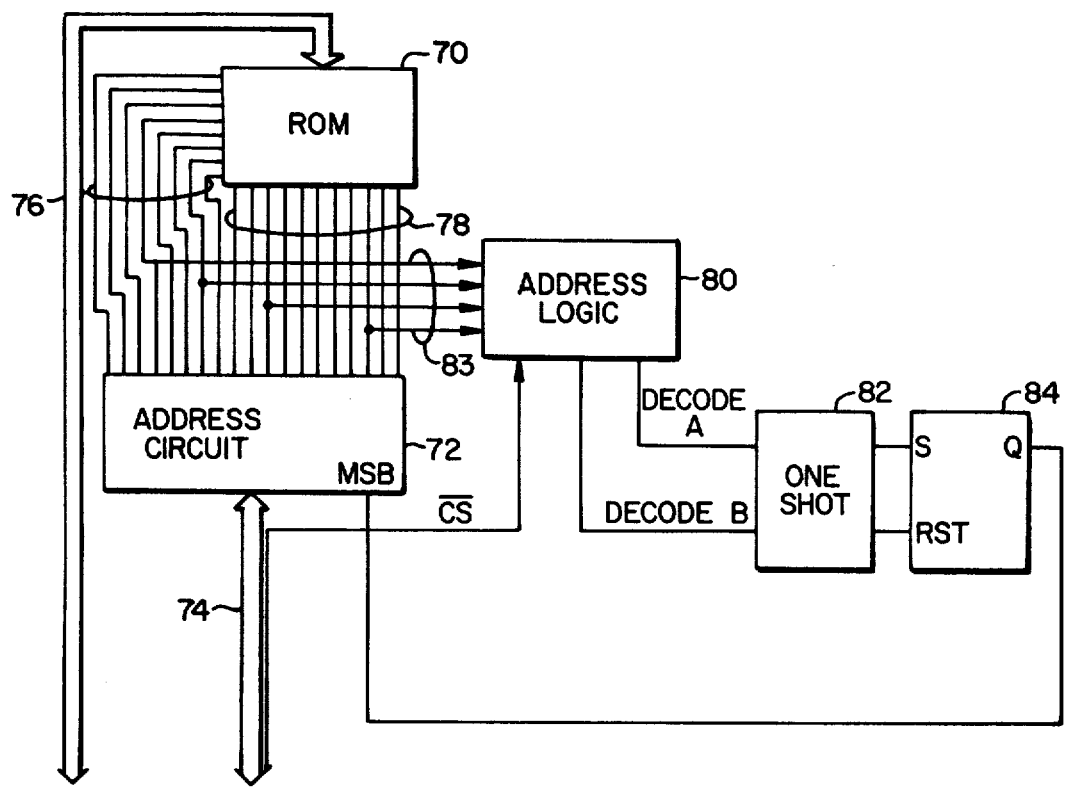
FIG._5.
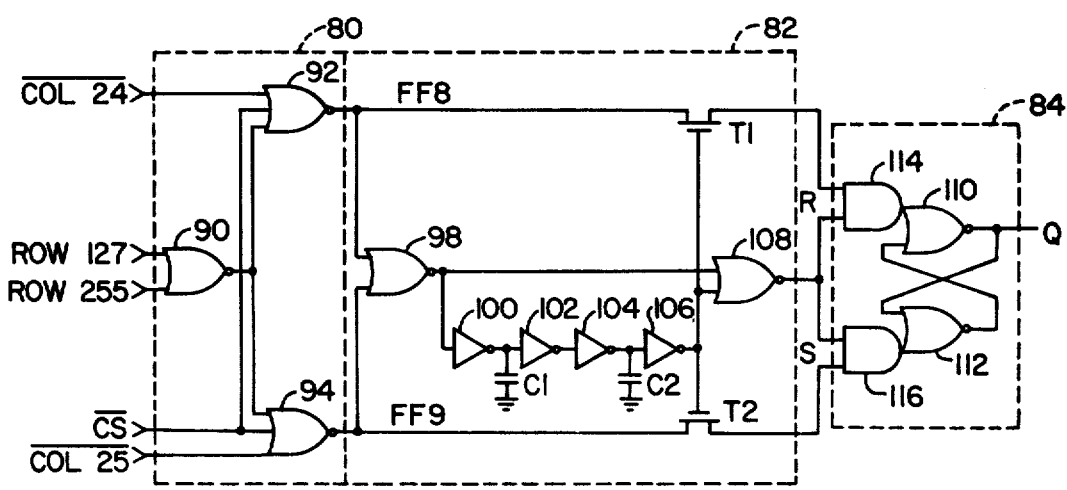
FIG._6.

MEMORY CARTRIDGE FOR VIDEO GAME SYSTEM

This is a division of application Ser. No. 261,301, filed May 7, 1981, now U.S. Pat. No. 4,368,515.

REFERENCE TO RELATED PATENTS

This application is generally related to subject matter of the type shown in U.S. Pat. No. 4,112,422, entitled Method and Apparatus for Generating Moving Objects on a Video Display Screen issued Sept. 5, 1978 to Mayer et al. The Mayer et al. patent describes a microprocessor and associated game console electronics for generating signals used to control the position and movement of images of objects on the display screen of a video game.

BACKGROUND OF THE INVENTION

This invention generally relates to digital systems that use a fixed number of signal lines for communicating addresses to a digital memory element, or other digtal storage device having a plurality of addressable memory locations, and more particularly to an apparatus and method that increases the number of available addresses capable of being used to address the memory element.

Recent electronic advances, particularly in the digital arts, have witnessed a proliferation of a wide variety of digital systems, from large scale systems incorporating a number of processing units to consumer goods incorporating microprocessors. On the consumer side, for example, the TV game industry has for some time been producing video games for home use that incorporate microprocessors to maintain and control game play operation.

One form of such a video game currently enjoying substantial popularity today includes a console unit containing the microprocessor and other electronic circuitry that receives player input information from player manipulated elements (i.e., paddles, joysticks, and the like) and generates electronic signals that are used to drive a TV display unit. The game console is provided with a receptacle that removably receives an inexpensive cartridge. The cartridge contains an electronic microcircuit, including a read-only-memory (ROM) that stores the program of the video game to be played. With a plurality of such interchangeable cartridges, a player can program the microprocessor of the video game to execute any one of a large selection of video games.

One of the potenital problems with any digital system and one which has specifically developed in the video game industry, resides in the limit of the addressable memory space of the system, i.e., the number of individually addressable memory locations which can be uniquely addressed by the processor unit. This limit is related to the number of signal lines used to make up the address bus that conducts address signals to the memory space. For example, the video game type referred to above couples a portion of the system's address bus, consisting of 12 signal lines, via appropriate wiring and a connector plug to the ROM of the microcircuit contained in the cartridge. This provides for a maximum of $2^{12}$ or 4,096 uniquely addressable ROM memory locations for containing the program instructions used by the microprocessor to define the video game. As experience is gained, and programming technique improves, it has become desirable to increase the number of addressable memory locations in individual cartridges. However, conventional addressing techniques are limited by the number of address signal lines available at the game console/cartridge connector.

Accordingly, it is desirable to increase the number of addressable memory locations without changing the number of address signal lines in the current connector.

SUMMARY OF THE INVENTION

The present invention provides a bank switching memory and method for increasing the number of individual address locations that can be addressed in a digital system. The present invention expands the available memory space beyond that capable of being addressed by a conventional addressing having a unique memory location associated with a unique address. Specifically, the invention is used to expand the number of ROM memory locations contained in the game cartridge of a video game system without requiring additional address lines.

According to the present invention, supplemental address decode logic is coupled between the address bus and the memory element. The address decode logic monitors the address signals communicated on the address bus and, when a preselected address is detected, a selection signal is generated. The selection signal is applied to the address circuit of the ROM, together with the address bus, preferably as the most significant bit (MSB) of the address. This selection signal is terminated in response to the detection of another preslected address. Thus, an existing binary system having an address bus limited to N signal lines for addressing a maximum of a $2^N$ memory locations is now capable of addressing $2^{N+1}$ memory locations.

In the preferred embodiment of the present invention, the address decode logic includes a flip-flop which has applied to its set/reset inputs thereof pulses generated when corresponding ones of the selected addresses are detected to latch the occurrence of the pulses. The output of the flip-flop forms the selection signal. A first predetermined address is communicated on the address bus to set the flip-flop, designating one portion of the $2^{N+1}$ ROM memory locations to be accessed by the signals communicated on the address bus, and a second predetermined address signal causes the flip-flop to be reset, designating the other portion of the $2^{N+1}$ ROM memory locations to be addressed.

The preferred embodiment of the invention, including the program ROM with which it operates, is incorporated in a single microcircuit "chip" that is mounted within the video game cartridge. By supplementing the program ROM contained in video game cartridges, existing video game apparatus can be programmed for more complex video games; existing video games can be improved to operate faster; and cartridges can be made to contain a greater number of individual games. These are merely some of the advantages that flow from increasing the memory space available for storing the microinstructions used to direct microprocessor control of the game.

However, the present invention need not be limited to increasing the number of program ROM memory locations in an alternative embodiment. The microcircuit chip housed within the cartridge can be structed to include the program ROM and a random-access-memory (RAM), the invention being used to select which memory (i.e., program ROM or RAM) will be accessed, as well as generate the read/write signal required by RAM. Thereby, an existing system can be provided with additional RAM memory as needed. As will be seen, the concept can be expanded to provide additional addressing capability for increased program memory space.

The preferred embodiment of the invention is set forth in detail in the following description which, when read in conjunction with the accompanying drawing, will make evident additional objects, features and advantages of the present invention.

BRIEF DESCRIPTION OF THE DRAWINGS

FIG. 1 is a perspective view of a game cartridge containing a microcircuit constructed in accordance with the present invention and a game console for receiving the cartridge;

FIG. 2 is a block diagram of a game console and a cartridge constructed in accordance with the present invention;

FIGS. 3, 4 and 5 are block diagrams of preferred embodiments of the invention; and FIG. 6 is one example of a detailed schematic diagram demonstrating one implementation of portions of the circuit shown in FIG. 5.

DETAILED DESCRIPTION OF THE INVENTION

FIG. 1 is a perspective view of a commercial video game system that includes a cartridge 10 which is designed to be removably inserted in a socket 12 of a game console 14. The cartridge is portable and contains a circuit board 16 which carries an electronic microcircuit 18. Circuit board 16 includes a connector portion 20 with a number of printed circuit leads 22 thereon that establish electrical connection between the microcircuit 18 carried by the circuit board 16 and a connector contained within console 14.

Referring to FIG. 2, the electronics housed within console 14 is schematically illustrated as including a microprocessor unit (MPU) 30 which functions to maintain game play control over game electronics 32. Communication between MPU 30 and game electronics 32 is established via a conventional 8-bit data bus 36 and a 12-bit address bus 38. Specifically, MPU 30 and game electronics 32 comprise apparatus for generating moving objects for a video game display as described in U.S. Pat. No. 4,112,422 entitled "Method and Apparatus for Generating Moving Objects on a Video Display Screen," issued Sept. 5, 1978 to Mayer et al. and incorporated by reference.

FIG. 2 also illustrates the microcircuit that is housed within cartridge 18 including a read-only-memory (ROM) 40 which contains the program instructions used to direct operation of MPU 30. Data output lines 42 of ROM 40 are electrically connected to data bus 36 by connector leads 22a on connector 20. Similarly, 12-bit address bus 38 is electrically coupled to address circuit 46 of program ROM 40 via 12 connector leads 22b.

The 12 address signal lines 44 are also conducted to a supplemental addressing circuit, including an address decode logic 48. Address decode logic 48 is coupled to DECODE A and DECODE B signal lines that are connected to the set (S) and reset (RST) inputs of a flip-flop 50 respectively. The Q output of flip-flop 50 is coupled to an address circuit 46 of ROM 40 via a signal line 52, where it combines with the 12 address signal lines 44 to become a 13th address line for addressing ROM 40.

ROM 40 is accessed by address signals generated by MPU 30. These address signals are conducted on signal line 44 to address circuits 46 of ROM 40 where they are supplemented with the signal conducted from the Q output of flip-flop 50 on signal line 52. The Q output signal generated by the flip-flop 50 functions as the most significant bit (MSB) of a 13-bit address formed to designate a memory location of the ROM 40. Stated differently, and as illustrated in FIG. 2, the supplementary signal generated by the flip-flop 50 divides the memory locations of the ROM 40 into two identifiable groups: group A and group B. Group A consists of those memory locations addressable by the address signals that are communicated on the address signal lines 44 when the Q output of the flip-flop 50 is a logic ZERO; group B consists os those memory locations that are addressed when the Q output of the flip-flop 50 is a logic ONE.

Selection betweeen these two groups of memory locations contained in ROM 40 is effected by designating a pair of the 12 bit addresses (hereinafter address A and address B) as addresses that will cause address decode logic 48 to generate signals that are conducted on the DECODE A or DECODE B signal lines respectively. Thus, assuming that the Q output of the flip-flop 50 is a logic ZERO, the 12-bit addresses conducted to the address circuit 46 of the ROM 40 will access those memory locations associated with this condition of flip-flop 50, that is, group A. Each 12-bit address conducted on the address signal lines 44 is also applied to the address decode logic 48 which determines whether the presently conducted address is address A or address B. If not, the address decode logic 48 remains inactive and no signals are conducted on the DECODE A and DECODE B signal lines, leaving flip-flop 50 in its present state.

If, however, it is desired to access one of the group B memory locations, address B is conducted on the address signal lines 44. The address decode logic 48 decodes the address and issues on the DECODE B signal line a pulse that is applied to the S input of the flip-flop 50, setting the flip-flop and causing the Q output to become a logic ONE. All 12-bit addresses conducted thereafter on the signal lines 44 will cause those memory locations associated with this present state of flip-flop 50 to be accessed, i.e., the memory locations of group B, until address B is conducted to the ROM 40, switching flip-flop 50 and accessing the alternate group of memory locations.

Similarly, once flip-flop 50 is set to address group B memory locations, address decode logic 48 will generate a DECODE A signal in response to address A appearing on the address signal lines which will reset flip-flop 50, set the Q output to a logical one and result in the addressing at GROUP A memory locations.

The addresses that are applied to the address circuit 46 will cause the contents of the selected memory location of the ROM 40 to appear on the data output lines 42. From there, the contents are communicated to the data bus 36 in the game console 14 via connector leads 22a.

Typically, in many commercially available memory devices, both ROM and random-access-memory (RAM) are provided with a chip select (CS) pin that allows the particular memory device chip to be selected or deselected, as desired. Many embodiments of these types of memory devices incorporate the CS input in combination with tri-state data output circuitry, allowing the output lines of two or more such devices to be connected in parallel. Referring to FIG. 3, where like elements are given the same numeral designations as those used in FIG. 2, an alternate embodiment of the present invention utilizing such memory devices is illustrated. As FIG. 3 illustrates, a ROM 40A is supplemented with a supplemental memory 40B (which could be either ROM or RAM), and carried by the circuit board 16 within the cartridge 10 (FIG. 1). The data output lines 42A and 42B from the ROM 40A and supplemental memory 40B, respectively, are connected in parallel and to the data lines 42. Address signal lines 44 are conducted to the address circuits (not shown in FIG. 3) of both the ROM 40A and supplemental memory 40B, and, as in FIG. 2, to the address decode logic 48. In turn, address decode logic 48 is coupled to the S and RST inputs of the flip-flop 50 by the DECODE A and DECODE B signal lines, also as in FIG. 2. The Q and $\overline{Q}$ outputs of the flip-flop 50 are respectively connected to the CS inputs of the ROM 40A and the supplemental memory 40B by the signal lines 52A and 52B.

In the embodiment of FIG. 3, memory locations are physically divided into two physical groups: One group of memory locations resides in ROM 40A, the other in supplemental memory 40B. Selection between which of two devices is accessed is made (as with the embodiment of FIG. 2), by designating two addresses to be communicated to cause the address decode logic 48 to issue output signals on the DECODE A or B signal lines corresponding to the received adress. For example, a predetermined address $A_1$ is selected to cause the flip-flop 50 to be set. In turn, the Q output of the flip-flop 50 becomes a logic ONE and the $\overline{Q}$ output a logic ZERO. The respective outputs of the flip-flop 50 are conducted to the respective CS inputs of the ROM 40A and the supplemental memory 40B, selecting the data from ROM 40A to be conducted to the output lines 42A, and deselecting the supplemental memory 40B. Alternately, appearance of the predetermined address B on address signal lines 44 will cause the address decode logic 48 to issue a signal on the signal line DECODE B to reset the flip-flop 50, causing the Q and $\overline{Q}$ outputs of the flip-flop to reverse their binary states, selecting supplemental memory 40B and deselecting ROM 40A as the accessed memory device.

It should be evident that the invention need not be limited to selecting between one of only two portions of a designated memory space. Rather, three or more predetermined addresses can be designated for selection of a corresponding number of memory location groups by expanding the address decode logic 48 and the required number of flip-flops.

FIG. 4 illustrates an expanded version of the embodiment of FIG. 3, with some modification. Here, in FIG. 4, a number of memory devices, memories A-M, are provided, having their respective data output lines 58A-58M connected in parallel and to the output lines 42. The address signal lines 44 are coupled to the address circuits (not shown) of each of the memories A-M and to an address decode logic 60 that monitors the address signals communicated on the address signal lines 44. In response to detection of one of the predetermined addresses, designated to select one of the memories A-M for access, the address decode logic 60 will generate a pulse signal that is conducted on one of the signal lines SELECT A-SELECT M to a latch network 62. Latch network 62, which may be in the form of a plurality of flip-flops, one for each of the signal lines SELECT A-SELECT M, temporarily stores the received signal until a different signal is received from the address decode logic 60. The output lines 64a-64m are respectively connected to the chip select (CS) inputs of the memories A-M.

In operation, address signals are conducted on the address signal lines 44 and applied to the respective memory circuits of memories A-M. Data from the memory location designated by the address will appear on that set of data output lines 58A-58M corresponding to the memory selected by its CS input. Only one of the memories A-M will generally be selected at any one time and, therefore, a chip SELECT signal will generally only be present on one of the signal lines 64a-64m at any moment in time. Selection of the particular memory A-M is effected basically as described with respect to FIGS. 2 and 3: predetermined addresses corresponding to the memories A-M are conducted on the signal lines 44 to cause the address decode logic to issue a pulse on one of the SELECT A-SELECT M signal lines. The generated pulse is received by the latch network 62, correspondingly causing a chip select to be conducted on only one of the signal lines 64a-64m to the CS input of the memory A-M corresponding to the decoded predetermined address.

It is well known in this art that, due to propagation delays and other factors inherent in electronic circuitry, changes in the address signal received by the address decode logic 48 (FIGS. 2 and 3) or the address decode logic 60 (FIG. 4) do not change simultaneously. That is, the changes of state that occur on the individual ones of the signal lines may lead or lag one another so that during such transitions, addresses may momentarily appear that are not intended. Accordingly, some provision must be made in order to prevent the address decode logic in question from erroneously reacting to these transitional signals to inadvertently cause unwanted memory locations to be accessed. One method of preventing such erroneous action is to make the decoding process synchronous; that is, for example, the DECODE A-DECODE B (FIGS. 2 and 3) or the SELECT A-SELECT M (FIG. 4) signal could be gated by a clock signal. However, this would necessitate a clock signal line for communicating the clock signal to the respective address decode logic. Thus, FIG. 5 illustrates yet another way of preventing such spurious signals.

FIG. 5 is a block diagram of yet another preferred embodiment of the present invention, illustrating a ROM array 70 (i.e., the array of memory locations) that receives specific, decoded row and column signals from an address circuit 72 via row and column signal lines 76, 78, respectively. The signals generated by the address circuit 72 select the specific memory location of the ROM array 70 that is designated by the address signals communicated to the address circuit on address signal lines 74.

Address logic 80 receives a selected number of the row and column signal lines 76, 78 via the signal line group 83 for decoding the preselected addresses. DECODE A and DECODE B signals are generated by the address logic 80 in response to detecting the preselected addresses which indicate a switch from one group or "bank" of memory locations of the ROM array 70 to another. A monostable multivibrator device or "one-shot" 82 receives the DECODE A and DECODE B signals from the address logic 80 and prevents spurious transients on the address line 76, 78 from causing an inadvertent switchover by requiring the DECODE A and DECODE B signals to stabilize before applying them to the set (S) and reset (RST) inputs of a flip-flop 84, respectively. The Q output of the flip-flop 84 is in this embodiment coupled to the address circuit 72 as the most significant bit (MSB) of the address applied thereto.

Turning now to FIG. 6, the detailed schematic diagram of the address logic 80, oneshot 82, and flip-flop 84 of FIG. 5 is illustrated. As shown, the address logic 80 takes advantage of the initial decoding performed by the address circuit 72 (FIG. 5). Here, the addresses (in hexadecimal) FF8 and FF9 are selected as the predetermined addresses used to set or reset the flip-flop 84. As FIG. 6 indicates, the predetermined hexidecimal address FF8 will, after initial decoding by the address circuit 72, correspond to activation of the ROW 127 or ROW 255 and COLUMN (COL) 24 signals. Similarly, active ROW 127 or ROW 255 and COL 25 signals will correspond to the predetermined hexadecimal address FF9. In addition, a chip select ($\overline{SC}$) signal is used here to designate selection of the ROM array 70 for access, as opposed to other memory elements (not shown) of the system incorporating the invention. In this example the $\overline{CS}$ signal is an active LOW, i.e., a logic ZERO designate selection of the ROM array 70.

FIG. 6 shows the address logic 80 as including a two input NOR gate 90 for receiving the ROW 127 and ROW 255 signals from the ROW signal line 76 (FIG, 5), and performs an ORING function on these signals. Three input NOR gates 92 and 94 function as AND gates. The NOR gate 92 performs an ANDING of the signal produced by the NOR gate 90 and $\overline{COL\ 24}$; the NOR gate 94 ANDs the output of the NOR gate 90 with the $\overline{COL\ 25}$ signal. The $\overline{CS}$ signal functions to enable the NOR gates 92 or 94. The output of the NOR gates 92 and 94 are signal lines FF8 and FF9, respectively, designating recognition of either the hexadecimal address FF8 or FF9 communicated on the address signal lines 74.

The two signal lines FF8 and FF9 are both applied to a NOR gate 9B, which forms the input stage of the oneshot 82. The output of the NOR gate 98 is applied to a delay network comprising four inverters, 100, 102, 104 and 106 and capacitors C1 and C2, and to a NOR gate 108. The output of the last inverter 106 of the delay network is also applied to the NOR gate 108, as well as the control leads of transfer switches T1 and T2. If the signal produced by the NOR gate 98 remains present for a sufficient length of time, determined by the time for the signal to propagate through the delay provided by the inverters 100-106 and capacitors C1 and C2, the signal is considered valid and NOR gate 108 is activated. At the same time the transfer switches are turned off, so the decoded address signal stored on R or S by signal line FF8 or FF9 sets or resets the flip-flop 84.

The flip-flop 84 is shown as including a pair of cross-coupled NOR gates 110 and 112 which form the bistable or latching portion of the flip-flop. An AND gate 114 forms a gated reset input of the flop-flop 84 and an AND gate 116 forms the gated set input of the flip-flop. The signals produced by the AND gates 114 and 116 respectively reset or set the latching portion (NOR gates 110 and 112) of the flip-flop, causing the Q output of the flip-flop to assume a logic ZERO or a logic ONE, as the case may be.

The embodiment of FIGS. 5 and 6 operates as follows: Address signals are continually being formed and communicated on the signal lines 74 to the address circuit 72. The selected decodes (i.e., $\overline{COL\ 24}$, $\overline{COL\ 25}$, $\overline{ROW\ 127}$, and $\overline{ROW\ 255}$) produced by the address circuit 72 are applied to the NOR gate 90, 92, and 94 of the address logic 80. If, at any moment in time, the address signals appearing on signal lines 74 form either of the predetermined addresses FF8 or FF9, and $\overline{CS}$ is a logic ZERO (selecting ROM array 70 for access), a corresponding signal will appear on one of the signal lines FF8 or FF9. This corresponding signal is applied by the signal line FF8 or FF9 to the NOR gate 98 and, after a certain delay the signal propagates through the inverters 100-106 to switch the NOR gate 108 and transfer switches T1 and T2. If the corresponding signal is still present on the signal line FF8 or FF9 at the time the transfer switches T1 and T2 are switched, the signal will be passed to the R or S input of the flip-flop 84; at the same time, the AND gates 114 and 116 are enabled by the signal produced by the NOR gate 108 and the flip-flop is thereby reset or set, as the case may be.

On the other hand, if the address signal decoded by the NOR gates 92 or 94 is merely a transient, resulting from a transition from one address to another, the signal will not be present when the transfer switches T1 and T2 are switched, and the NOR gate 108 will be found to be disabled when the propagation time expires. Accordingly, the AND gates 114 and 116 of the flip-flop 84 remain disabled and the state of the flip-flop will be left unchanged.

When switching from one group of memory locatioons to another, using the present invention, it should be evident that two memory locations are accessed by each predetermined "switching" address. For example, in FIGS. 5 and 6 the hexadecimal address FF8 will access the two memory locations: one in that group defined when the Q output of the Filp-flop 84 is a logic ONE, and one defined when the Q output is a logic ZERO. Accordingly, in the preferred embodiment, those memory locations specified by the hexadecimal address signals FF8 and FF9, regardless of the state of the MSB input to the address circuit 72 contain a NO-OPERATION (NOP) instruction or designation.

When the invention is used to expand the memory capacity of that portion of a video game system that is resident in the cartridge 10 (FIG. 1), the circuitry, including the memory, is fabricated as a single microcircuit chip. Thus, for example, the ROM array 70, address circuit 72, address logic 80, Oneshot 82, and flip-flop 84 are preferably fabricated as a single integrated circuit chip and packaged in a conventional dual-in-line package (DIP). The package is configured as an 8-bit×8K memory (64K bits) having a pin configuration that is identical to the 8-bit×4K memory package (32K bits) presently carried by existing cartridges. Thus, no changes are needed in the cartridge 10 (FIG. 1) in order to convert a present 32K system to a 64K system.

Thus, it will be seen that the invention provides for greatly increasing the number of individual addresses that can be generated by a digital system having an address bus for communicating those addresses limited to N individual signal lines, correspondingly expanding the available memory space of the system. The present invention provides for a significant increase in memory space of a digital system without extensive modifications to the system. Thereby, a substantial increase in available memory space is obtained at very little cost.

and effort. Although several embodiments of the invention have been shown and described by way of example, it will be obvious that other adaptations and modifications can be made without departing from the true spirit and scope of the invention.

I claim:

1. A cartridge adapted to be removably attached to a video game system of the type having an address bus and a data bus for providing address signals on the address bus and for receiving data signals on the data bus, the cartridge comprising:
   a connector having primary address lines and data lines, the connector being adapted to conductively couple the primary address lines to the address bus and to conductively couple the data lines to the data bus when the cartridge is attached to the video game system;
   a supplemental address line;
   first memory means coupled to the primary address lines and to the supplemental address line and having a plurality of memory locations for providing digital signals corresponding to data stored in selected memory locations in response to the address signals on the primary address lines and the presence of a supplemental address signal on the supplemental address line;
   second memory means coupled to the primary address lines and to the supplemental address line having a plurality of memory locations for providing digital signals corresponding to data stored in selected memory locations in response to the address signals on the primary address and the absence of a supplemental address signal on the supplemental address line; means for coupling the digital signals provided by the first and second memory means to the data lines; and
   decoder means coupled to the primary address lines and to the supplemental address line for providing the supplemental address signal on the supplemental address line in response to detecting a combination of address signals corresponding to a first address on the primary address lines.

2. A cartridge as in claim 1 wherein the decoder means terminates the supplemental address signal on the supplemental address line in response to detecting a combination of address signals corresponding to a second address on the primary address lines.

3. A cartridge as in claim 2 wherein:
   each of the first and second memory means has a selection input for receiving a memory select signal; and
   the supplemental address line comprises a pair of supplemental address lines, each one interconnected with the selection input of one of the memory means, the supplemental address signal thereby serving as the memory select signal wherein the first memory means is selected in response to the first address and the second memory means is selected in response to the second address.

4. A cartridge as in claim 3 further including latch means interconnected with the decoder means and the selection inputs of the first and second memory means, for providing the memory select signals, said latch means holding the memory select signals until another one of the first or second addresses is detected.

5. A cartridge adapted to be removably attached to a video game system of the type having an address bus and a data bus for providing address signals on the address bus and for receiving data signals on the data bus, the cartridge comprising:
   a connector having primary address lines and data lines, the connector being adapted to conductively couple the address lines to the address bus and to conductively couple the data lines to the data bus when the cartridge is attached to the video game system;
   a supplemental address line;
   memory means coupled to the primary address lines and to the supplemental address line, for providing digital signals corresponding to data stored in selected locations from a first plurality of memory locations in response to the address signals on the primary address lines and the presence of a supplemental address signal on the supplemental address line, and for providing digital signals correspond to data stored in selected locations from a second plurality of memory locations in response to the address signals on the primary address lines and the absence of a supplemental address signal on the supplemental address line;
   means for coupling the digital signals provided by the memory means to the data lines; and
   decoder means coupled to the primary address lines and to the supplemental address line for providing the supplemental address signal on the supplemental address line in response to detecting a combination of address signals corresponding to a first address on the primary lines.

6. A cartridge as in claim 5 wherein the decoder means terminates the supplemental address signal on the supplemental address line in response to detecting a combination of address signals corresponding to a second address on the primary address lines.

7. A cartridge as in claim 5 further comprising M supplemental address lines, and wherein:
   the address bus has N signal lines;
   the connector has N primary address lines;
   the memory means has $2^{N+M}$ locations for storing data, and includes a memory address circuit having N+M signal inputs, of which N inputs are coupled to the N primary address lines, and M inputs are coupled to the M supplemental address lines; and
   the decoder means provides M supplemental address signals on the M supplemental address lines, each signal being provided in response to detecting one of M combinations of address signals on the primary address lines.

8. A cartridge adapted to be removably attached to a video game system of the type having an address bus and a data bus for providing address signals on the address bus and for receiving data signals on the data bus, the cartridge comprising:
   a connector having primary address lines and data lines, the connector being adapted to conductively couple the address lines to the address bus and to conductively couple the data lines to the data bus when the cartridge is attached to the video game system;
   a supplemental address line;
   memory means coupled to the primary address lines and to the supplemental address line and having a plurality of memory locations for providing digital signals coresponding to data stored in selected memory locations, a distinct memory location being accessed in response to each unique combination of address signals on the primary address lines and the supplemental address signal on the supplemental address line;

means coupling the memory means to the data lines for communicating the digital signals to the connector; and decoder means coupled to the primary address lines and to the supplemental address line for providing a supplemental address signal on the supplemental address line in response to a combination of address signals corresponding to a first address on the primary address lines.

9. A cartridge as in claim 8 wherein:

the cartridge includes a plurality of supplemental address lines;

the locations in the memory means are accessed in response to unique combinations of address signals on the primary addres lines and the plurality of supplemental address lines; and the decoder means provides a plurality of supplemental address signals on the supplemental address lines in response to combinations of address signals corresponding to switching addresses on the primary address lines.

10. A cartridge as in claim 9 wherein the decoder means terminates the supplemental address signal on the supplemental address line in response to detecting a combination of address signals corresponding to a second address on the primary address lines.

11. A cartridge adapted to be removably attached to a video game system of the type having an address bus and a data bus for providing address signals on the address bus, the cartridge comprising:

a connector having primary address lines and data lines, the connector being adapted to conductively couple the address lines to the address bus and to conductively couple the data lines to the data bus when the cartridge is attached to the video game system;

a supplemental address line;

memory means having a plurality of row and column lines and having a plurality of memory locations corresponding to different row and column lines for providing digital signals corresponding to data stored in selected memory locations, a distinct memory location being selected in response to signals on each unique row and column line pair, the memory means having data output means coupled to the data lines for communicating data signals thereto;

an address circuit coupled to the primary address lines, the supplemental address line and to the row and column lines for providing signals on row and column line pairs selected in response to address signals on the primary address lines and a supplemental address signal on the supplemental address line, a distinct row and column line pair being selected in response to each unique combination of address signals on the primary address lines and supplemental address line;

decoder means coupled to the row and column lines for providing a supplemental address signal on the supplemental address line in response to signals appearing on a first row and column line pair.

12. A cartridge as in claim 11 further including:

latch means coupled to the decoder means and to the supplemental address line for sustaining the supplemental address signal on the supplemental address line.

13. A cartridge as in claim 11 wherein the decoder means further includes means for terminating the supplemental address signal providing in response to signals appearing on a second row and column line pair.

14. A cartridge as in claim 13 further including:

latch means coupled to the decoder means and to the supplemental address line for sustaining either the supplemental address signal or the terminated supplemental address signal on the supplemental address bus.

15. A cartridge adapted to be removably attached to a video game system of the type having an address bus and a data bus for providing address signals on the address bus and for receiving data signals on the data bus, the cartridge comprising:

a connector having primary address lines and data lines, the connector being adapted to conductively couple the primary address lines to the address bus and to conductively couple the data lines to the data bus when the cartridge is attached to the video game system;

memory means coupled to the primary address lines and to the data lines for providing digital signals representing data stored in locations corresponding to address signals on the primary address bus; and controller means coupled to said primary address lines and to said memory means for changing the correspondence between locations and address signals subsequent to predetermined ones of the address signals on the primary address lines.

* * * * *

UNITED STATES PATENT AND TRADEMARK OFFICE
CERTIFICATE OF CORRECTION

PATENT NO. : 4,432,067

DATED : February 14, 1984

INVENTOR(S) : Carl J. Nielsen

It is certified that error appears in the above—identified patent and that said Letters Patent is hereby corrected as shown below:

Column 12, Line 44 (Claim 15, line 15),
    replace "bus" with -- lines --.

Signed and Sealed this

Fifteenth Day of December, 1987

Attest:

DONALD J. QUIGG

*Attesting Officer*     *Commissioner of Patents and Trademarks*